United States Patent
Sly et al.

(10) Patent No.: US 6,449,166 B1
(45) Date of Patent: Sep. 10, 2002

(54) HIGH CAPACITY MEMORY MODULE WITH HIGHER DENSITY AND IMPROVED MANUFACTURABILITY

(75) Inventors: Thomas R. Sly, Cicero; Kevin M. Quinn, Syracuse, both of NY (US)

(73) Assignee: High Connection Density, Inc., Sunnyvale, CA (US)

( * ) Notice: Subject to any disclaimer, the term of this patent is extended or adjusted under 35 U.S.C. 154(b) by 31 days.

(21) Appl. No.: 09/645,858

(22) Filed: Aug. 24, 2000

(51) Int. Cl.[7] ................................................. H05K 7/02
(52) U.S. Cl. ........................ 361/760; 361/785; 361/790; 361/788; 361/803; 365/63
(58) Field of Search ................................ 257/723, 724, 257/728; 361/760, 783, 785, 790, 803, 788; 710/300, 301, 302; 333/32, 33, 246, 247, 12; 365/51, 52, 63

(56) References Cited

U.S. PATENT DOCUMENTS

| | | | | | |
|---|---|---|---|---|---|
| 3,832,575 A | * | 8/1974 | Dasgupta et al. | ........... | 307/208 |
| 3,992,686 A | * | 11/1976 | Canning | ................... | 333/84 M |
| 6,026,456 A | * | 2/2000 | Ilkbahar | ..................... | 710/101 |
| 6,081,430 A | * | 6/2000 | La Rue | ..................... | 361/788 |
| 6,128,685 A | * | 10/2000 | Cronin | ........................ | 710/126 |
| 6,137,709 A | * | 10/2000 | Boaz et al. | .................... | 365/51 |
| 6,266,252 B1 | * | 7/2001 | Karabatos | ................... | 361/788 |

* cited by examiner

Primary Examiner—Jayprakash N. Gandhi
Assistant Examiner—Thanh Y. Tran
(74) Attorney, Agent, or Firm—Salzman & Levy

(57) ABSTRACT

The present invention provides a double-sided memory module with improved memory device density and improved manufacturability, and with optional bus terminations mounted directly on the memory module for use with high speed, impedance-controlled memory buses. It also allows the same memory devices to be used on both sides of the card, instead of requiring memory devices with mirrored I/O connections on a second side as on prior art double-sided memory cards. The memory module may be formed on a conventional printed circuit card using cost-effective printed circuit board line widths and spaces with unpacked or packed memory chips attached directly to the memory module, while maintaining good signal integrity. Using memory modules with bus terminations mounted directly on the module improves the signal quality and integrity even further and therefore enhances system performance. Such designs may also eliminate the need for bus exit connections, thereby allowing the freed-up connection capacity to be used to address additional memory capacity on the module.

24 Claims, 6 Drawing Sheets

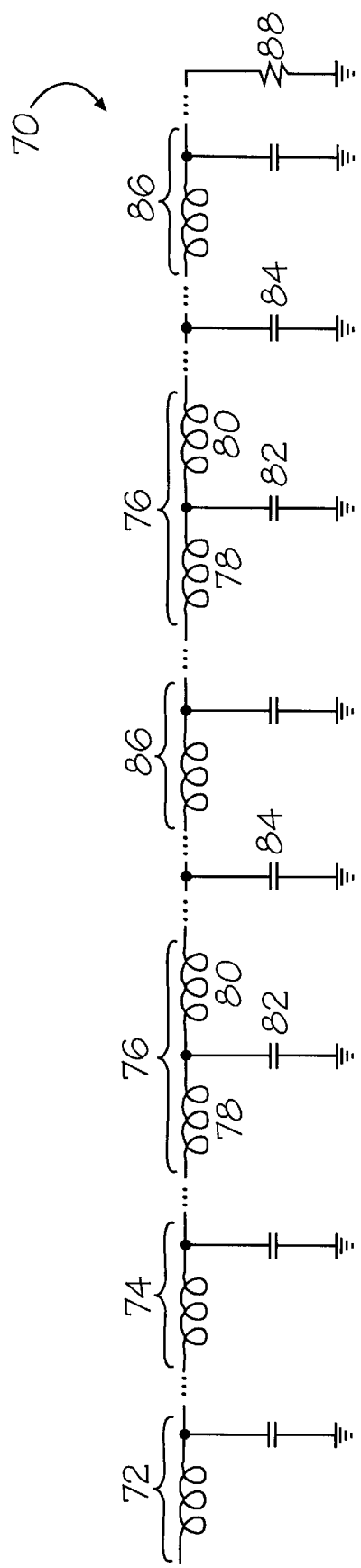
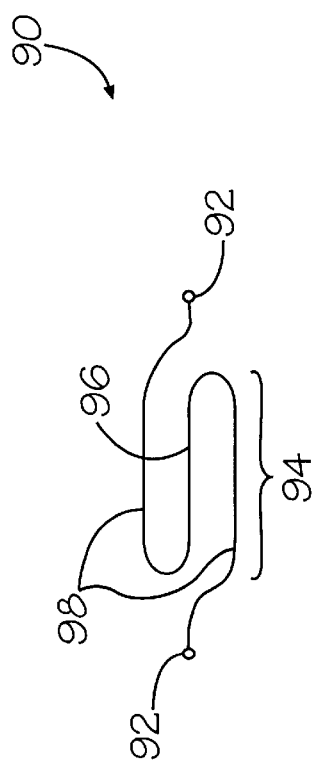
Figure 5
Figure 6

HIGH CAPACITY MEMORY MODULE WITH HIGHER DENSITY AND IMPROVED MANUFACTURABILITY

RELATED PATENT APPLICATIONS

This application is related to U.S. Pat. No. 5,928,005, issued to Li et al. for SELF-ASSEMBLED LOW INSERTION FORCE CONNECTOR ASSEMBLY, and copending U.S. patent applications, Ser. No. 09/461,069, filed Dec. 14, 1999; Ser. No. 09/461,065, filed Dec. 14, 1999; Ser. No. 09/461,064, filed Dec. 14, 1999, and copending U.S. patent application Ser. No. 09/645,859, filed concurrently herewith, all of which are hereby incorporated by reference.

FIELD OF THE INVENTION

The present invention relates to high density memory modules for computer applications and, more particularly, to higher density, double-sided memory modules having impedance controlled transmission line buses and, optionally, driver line terminators built into the memory modules.

BACKGROUND OF THE INVENTION

Modern, high speed digital computers and the sophisticated software running on them require ever-increasing amounts of volatile random access memory (RAM). As bus and clock speeds increase, the electrical drive requirements for servicing a number of memory devices become much more stringent than when slower memory was in use.

The operating speed of a memory system is largely determined by the electrical interconnections of the bus between the memory controller and the memory devices. As the data rate increases, the signal propagation times through the interconnections are no longer negligible compared to the transition time of the signals. At high bus speeds, those interconnections behave as transmission line networks. The response characteristics of such transmission line networks define the maximum usable speed of the memory bus.

In the current generation of memory packaging technology, the amount of memory physically available on a single card or module is controlled by two factors: the capacity of the memory devices (chips) themselves and the number of physical electrical connections that may be made to the module. The number of cards or modules which may be daisy chained is dependent solely upon the capacity of the line drivers or receivers. To ensure fast memory cycle times, extremely short, fast rise pulses are used.

For example, in conventional random access memory systems, because only one bit can exist on the bus during a certain time interval, the bus speed is determined mainly by the signal setup time of the bus. As a result, the highest data rate that such bus can currently achieve in PC memory systems is 266 Mbits per second. Usually, no impedance-matching termination is required or provided in such a conventional RAM system.

To achieve even higher bus speeds and, at the same time, allow for larger memory capacities, impedance controlled types of buses must be adopted. For example, RAMBUS® technology features a memory configuration wherein memory devices are disposed (packaged) on up to three RAMBUS Inline Memory Module (RIMM) cards all interconnected on a motherboard by a high speed data bus. One or more termination components are placed on the motherboard at the physical end of the bus.

In operation, address/data lines leave driver circuits on the motherboard and enter a first RIMM card in the memory chain. These same address/data lines must leave the RIMM via a complete, second set of connections. This routing continues through a second and third RIMM module before the driver lines reach their terminations. This memory/bus configuration allows very fast transit signals to be transmitted between a memory controller and a data storing device over relatively long buses. These buses allow multiple bits to propagate simultaneously down each line of the bus, thereby achieving access data rates of 800 Mbits per second. Even higher bus rates appear feasible in the future.

One most important feature of such buses is that the effective impedance of the signal propagation paths is well controlled. One end of the bus is terminated to the characteristic impedance of the bus in order to maintain signal fidelity and signal integrity.

In systems adopting such buses, the amplitudes of the driving signals are generally much smaller than amplitudes of conventional digital signals. This is due to the limitation on the driving strength (dv/dt) of the devices.

The above-mentioned factors make the reliable operation of such memory buses very dependent upon controlling the impedance of the interconnections along the bus. Impedance mismatches along the signal transmission path result in signal degradation, which, in turn, may lead to errors in data transmission. At the same time, maintenance of accurate timing among all of the signal bits and clocks is also critical to reliable data transmission. For this reason, minimizing signal-to-clock delay difference (data-to-clock skew) is another important requirement for such buses.

The latest generation of RAMBUS memory devices, having a capacity of 256 MB or 288 MB, are in narrower packages than their lower-capacity predecessors. This reduction could potentially help to increase the density of memory devices on a RIMM card. But in practice, the extra space is needed not only to interconnect the devices but also to ensure that the interconnections (i.e., the printed circuit traces) have the proper electrical characteristics to maintain signal integrity not only through the RIMM card but also through the entire memory system.

The present invention allows improvements in density and manufacturability over prior art memory systems using the 256 MB and 288 MB devices. This improvement in density can be used to reduce the size of the card physically, to increase the number of memory devices on a given card, which may allow for reduction in the number of RIMM cards required, or to incorporate terminations directly on the RIMM card. It is also possible to combine these benefits to meet specific requirements.

From a manufacturability point of view, it is now possible to use the same memory devices on both sides of the card, instead of using memory devices with mirrored I/O connections, as the prior art double-sided memory card required. This offers a significant advantage in managing chip supplies.

Prior art memory system designs generally consist of a memory controller, a clock driver and bus terminations all mounted on the motherboard with up to three memory slots between the controller and the termination. The data signals must pass through every module and also through a total of six edge connectors before they reach the termination. Because of their design, current edge connectors introduce impedance mismatches and crosstalk that degrade signal quality and therefore limit the performance of the signal channels.

The inclusion of the terminations on the memory modules themselves also provides several types of performance improvement. First, because only a single set of contacts need be used (i.e., there is no need to have the bus lines exit the module), the additional contact capacity may be devoted to addressing capability for even greater amounts of memory on a single card or module. By eliminating essentially half of the required contacts, an even greater number of chips (e.g., 64 chips) may be packaged on a single card.

Total bus path length is significantly reduced because more memory may be placed on a single card physically much closer to the driver circuits than has heretofore been possible. Even more improvement is obtained because the extra passage of signals through exit contacts is eliminated. Also eliminated is that portion of the bus path between the memory modules and the external terminator resistors of the prior art.

In addition, this inversive design may reduce the design complexity and manufacturing cost of both the memory module and the motherboard. For memory systems having one to three memory modules, using a terminated module as the last module helps to achieve maximum system performance.

It is, therefore, an object of the invention to provide a high capacity, high density memory card with double-sided memory chips supported thereon.

It is an additional object of the invention to provide a high capacity, high density memory module that requires only a single memory chip part number instead of the two typically required for two-sided designs.

It is an additional object of the invention to provide a high capacity, high density memory module with high electrical integrity.

It is another object of the invention to provide a high capacity, high density memory module with bus terminations provided on the memory module itself.

It is a still further object of the invention to provide a high density memory module which can operatively reduce data path lengths, thereby helping ease driver electrical requirements in a high speed digital computer or the like.

SUMMARY OF THE INVENTION

The present invention provides a double-sided memory module with improved memory device density and improved manufacturability, and with optional bus terminations mounted directly on the memory module for use with high speed, impedance-controlled memory buses. It also allows the same memory devices to be used on both sides of the card, instead of requiring memory devices with mirrored I/O connections on a second side as on prior art, double-sided memory cards. The memory module may be formed on a conventional printed circuit card using cost-effective printed circuit board line widths and spaces with unpacked or packed memory chips attached directly to the memory module, while maintaining good signal integrity. Using memory modules with bus terminations mounted directly on the module improves the signal quality and integrity even further and therefore enhances system performance. Such designs may also eliminate the need for bus exit connections, thereby allowing the freed-up connection capacity to be used to address additional memory capacity on the module.

BRIEF DESCRIPTION OF THE DRAWINGS

A complete understanding of the present invention may be obtained by reference to the accompanying drawings, when taken in conjunction with the detailed description thereof and in which:

FIG. 2b is a top view of a prior art memory card shown in FIG. 2a;

FIG. 2c is a side view of a prior art memory card shown in FIG. 2a;

FIG. 4b is a top view of a memory card of the present invention shown in FIG. 4a;

FIG. 4c is a side view of a memory card of the present invention shown in FIG. 4a;

FIG. 5 shows a simple electrical model of a high speed memory card;

FIG. 6 shows a section of printed circuit trace incorporating a novel technique to improve the overall signal integrity of a memory card with devices on both sides;

FIG. 7b is a top view of the self-terminating memory card of the invention shown in FIG. 7a;

FIG. 7c is a side view of the RIMM card of FIG. 7a.

DETAILED DESCRIPTION OF THE PREFERRED EMBODIMENT

Generally speaking, the present invention is a high density memory card or module made either from bare memory chips or from conventional memory chip packages mounted on memory cards. Optionally, these memory cards or modules have built-in bus terminations.

Figure 1:
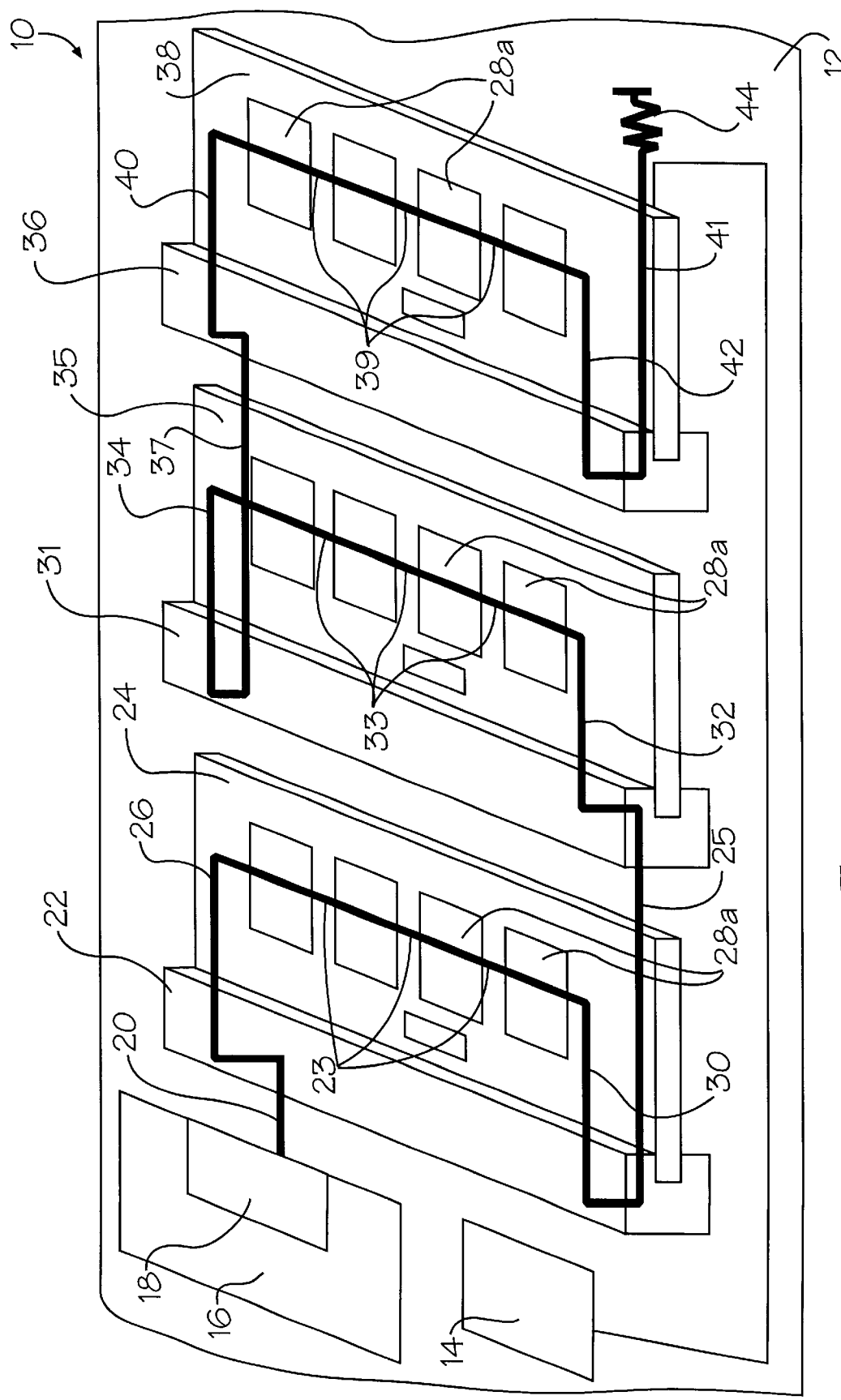
FIG. 1 is a schematic representation of a multi-card memory arrangement of the prior art with bus termination on the motherboard.

Referring first to FIG. 1, there is shown a schematic representation of a multi-card (three-card) memory system 10 that includes memory modules of the prior art. Conventional two-slot and three-slot boards required terminations on the motherboard 12, which were needed even when all slots were not used.

A portion of a motherboard 12 is shown with support circuitry needed for implementation of the RAMBUS memory system. A Direct RAMBUS Clock Generator (DRCG) circuit 14 and a master device 16 containing a Direct RAMBUS ASIC Cell (DRAC) 18 are implemented on motherboard 12. The RAMBUS channel segment 20 connects DRAC 18 to a memory socket 22. Socket 22 is physically connected to motherboard 12. RAMBUS channel segment 20 connections are generally made by printed wiring traces (not shown) on one or both surfaces of motherboard 12. Alternately, an internal printed wiring trace (not shown) can be used for connections. Socket 22 generally has a plurality of spring-loaded contacts designed to engage mating contact pads on a RIMM card 24.

RAMBUS channel segment 20 enters RIMM card 24 at a bus entry region 26 and is then connected to a number of individual memory devices 28a and 28b (not shown) attached to RIMM card 24 through device connection segments 23. The RAMBUS channel then exits RIMM card 24 via a RAMBUS channel exit region 30 and passes out of the first RIMM card 24 and back to motherboard 12. Additional printed wiring traces carry the RAMBUS channel segment 25 to a second socket 31 also on motherboard 12. Second socket 31 holds second RIMM card 35.

A RAMBUS channel entry portion 32, a series of memory devices 28a and 28b (not shown), a series of device connection segments 33, and a RAMBUS channel exit portion 34 make up second RIMM card 35. In a similar fashion, RAMBUS channel segment 37, through printed circuit traces, connects the exit portion 34 to a third socket 36, third RIMM card 38, third series of device connection segments 39, RAMBUS channel entry portion 40, and RAMBUS channel exit portion 42 make up the third RAMBUS memory card. RAMBUS channel segment 41 finally reaches terminations 44 at the end of the circuitous routing of the bus after passing through printed circuit traces. Terminations components, such as resistors, blocking capacitors and/or decoupling capacitors 44 are also placed on motherboard 12.

All RAMBUS channel signals must pass through three sockets 22, 31, 36 and across three RIMM cards 24, 35, and 38 before reaching terminations 44. The driver requirements to reliably access memory devices 28a and 28b on the three RIMM cards 24, 35, 38 are stringent. Signal degradation occurs along the path of RAMBUS channel, especially at connectors 22, 31, and 36. In addition, valuable "real estate" is consumed on the motherboard 12, itself.

For the particular embodiments discussed below, memory devices are connected to the printed circuit card through a solder ball grid array, an assembly technique commonly used today to attach semiconductors to printed circuit boards. It should be obvious to those skilled in the art that many other chip-attachment methods may be used instead.

Figure 2A:
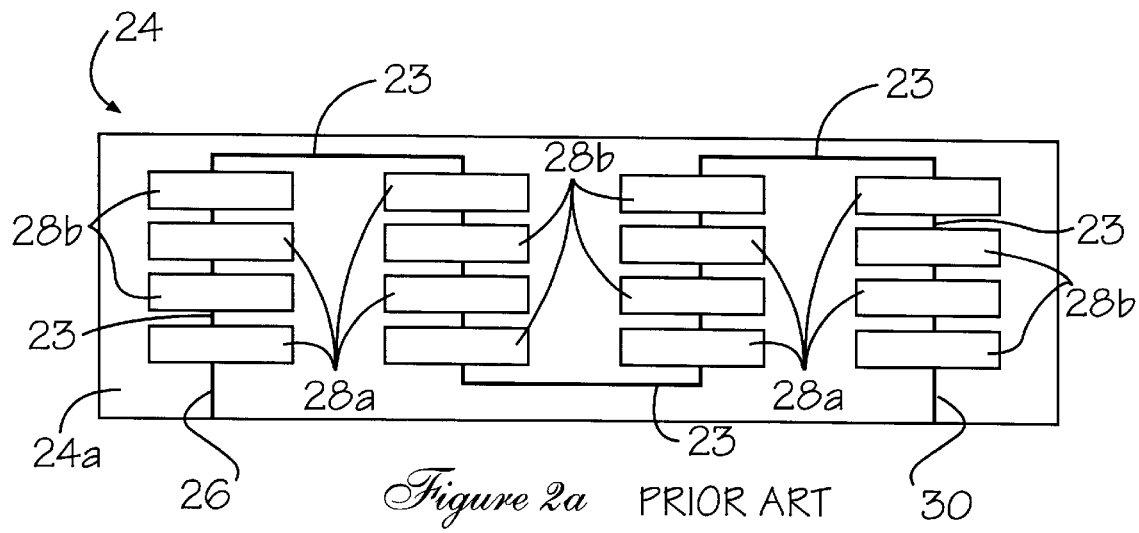
FIG. 2a is a front plan view of a prior art memory card shown in FIG. 1.
Figure 2B:
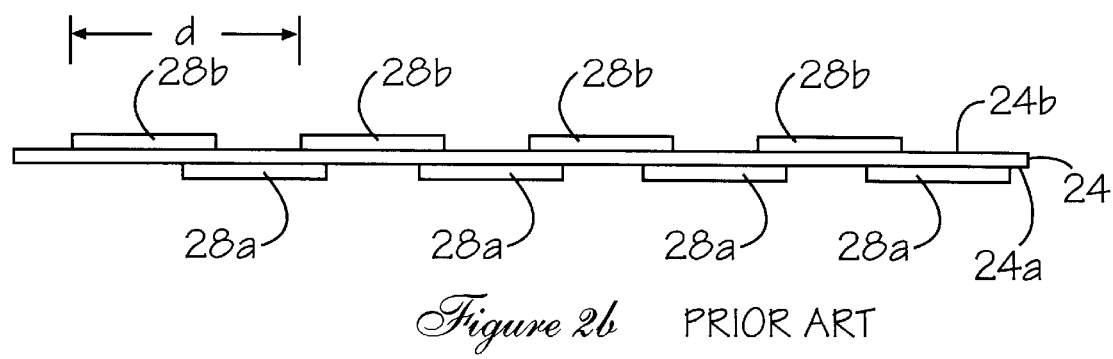
Figure 2C:
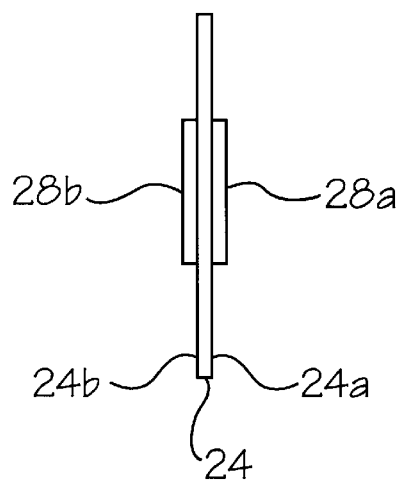

Referring now to FIGS. 2a, 2b, and 2c, there are shown front, top and side views, respectively, of first RIMM card 24 shown in FIG. 1. Since RIMM cards 35 and 38 (FIG. 1) are equivalent to prior art RIMM card 24, the information presented in FIGS. 2a, 2b, and 2c applies to them as well. Memory devices 28a and 28b may be placed in any of a wide variety of physical arrangements on card 24. RAMBUS channel segment 20 (FIG. 1) enters card 24 at a bus entry region 26 and is then connected to memory devices 28a and 28b through device connection segments 23. The RAMBUS channel next exits first RIMM card 24, via a RAMBUS channel exit region 30, and passes from first RIMM card 24 back to motherboard 12 (FIG. 1).

FIG. 2b is a top view of a prior art RIMM card 24 shown in FIG. 2a having memory devices 28a disposed on one side 24a of RIMM card 24 and memory devices 28b disposed on the opposite side 24b of RIMM card 24. The difference between memory devices 28a and 28b is that the input/output (I/O) connections of memory device 28b are mirrors of the I/O connections of memory device 28a. The use of the two different device footprints significantly simplifies the wiring to interconnect the devices on a two-sided memory card. Unfortunately the manufacturer is required carry and control two different memory device part numbers and to ensure that each is populated only in appropriate locations.

The double-sided design also requires that the placement of memory devices 28a on first side 24a of card 24 be in a pattern that is offset from memory devices 28b on the second side 24b by one-half of the pitch "d" of the devices 28a on the first side 24a of card 24. This allows placement of pads (not shown) under the ball grid array and their connections to vias (not shown) in the printed circuit board to be wired efficiently and still have enough distance between the vias to route the RAMBUS channel signals between each of the memory devices 28a and 28b.

FIG. 2c is a side view of the RIMM card 24 of FIG. 2a also showing memory devices 28a on first side 24a and memory devices 28b on second side 24b.

Figure 3:
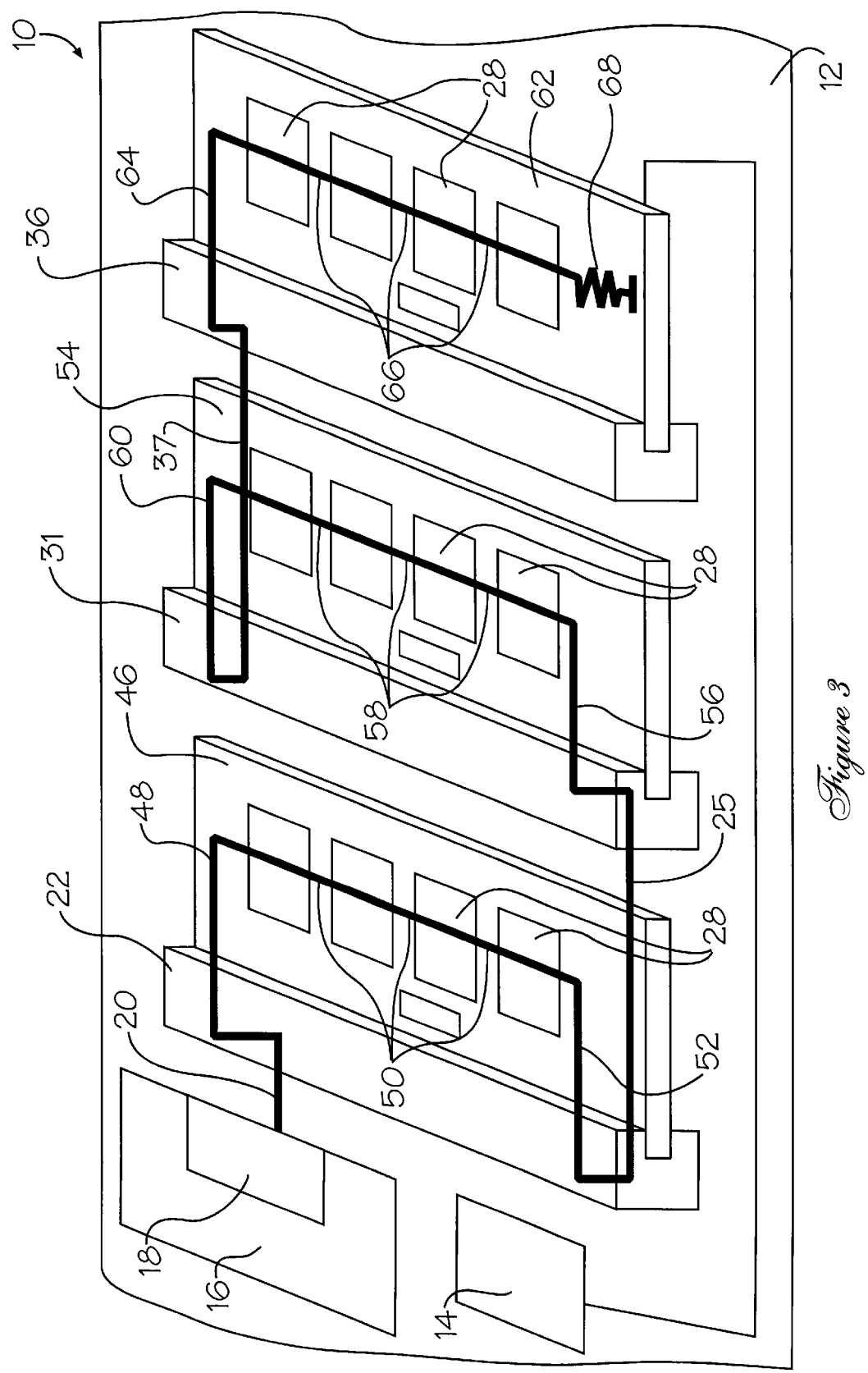
FIG. 3 is a schematic representation of a multi-card memory arrangement of the present invention including bus termination on the last memory module.

Referring now to FIG. 3, there is shown a schematic representation of a multi-card (three-card) memory system 10 with the inventive memory modules. A port-on of a motherboard 12 is shown with support circuitry needed for implementation of the RAMBUS memory system. A Direct RAMBUS Clock Generator (DRCG) circuit 14 and a master device 16 containing a Direct RAMBUS ASIC Cell (DRAC) 18 are implemented on motherboard 12.

The RAMBUS channel segment 20 connects DRAC 18 to a memory socket 22. Socket 22 is physically connected to motherboard 12. RAMBUS channel segment 20 connections are generally made by printed wiring traces (not shown) on one or both surfaces of motherboard 12. Alternately, an internal printed wiring trace (not shown) can be used for connections. Socket 22 generally has a plurality of spring-loaded contacts designed to engage mating contact pads on first inventive RIMM card 46.

RAMBUS channel segment 20 enters RIMM card 46 at a bus entry region 48 and is then connected to a number of individual memory devices 28 attached to RIMM card 46 through device connection segments 50. The RAMBUS channel then exits RIMM card 46 via a RAMBUS channel exit region 52 and passes out of the first RIMM card 46 and back to motherboard 12. Additional printed wiring traces carry the RAMBUS channel segment 25 to a second socket 31 also on motherboard 12. Second socket 31 holds second inventive RIMM card 54.

Similarly, the RAMBUS channel exits the second inventive RIMM card 54 and is connected through RAMBUS channel segment 37 to the last RIMM card 62, which also contains bus terminations 68. Terminations 68 typically consist of components such as resistors, blocking capacitors and/or decoupling capacitors. Unlike the prior art, terminations 68 are mounted directly on RIMM card 62, thereby eliminating the need for an exit portion of RAMBUS channel or printed circuit traces (not shown) on motherboard 12 to reach the terminations. The complete, additional set of contacts is thereby eliminated, allowing their use for addressing additional memory capacity or the like. In addition, valuable "real estate" is saved on the motherboard 12, itself.

Figure 4A:
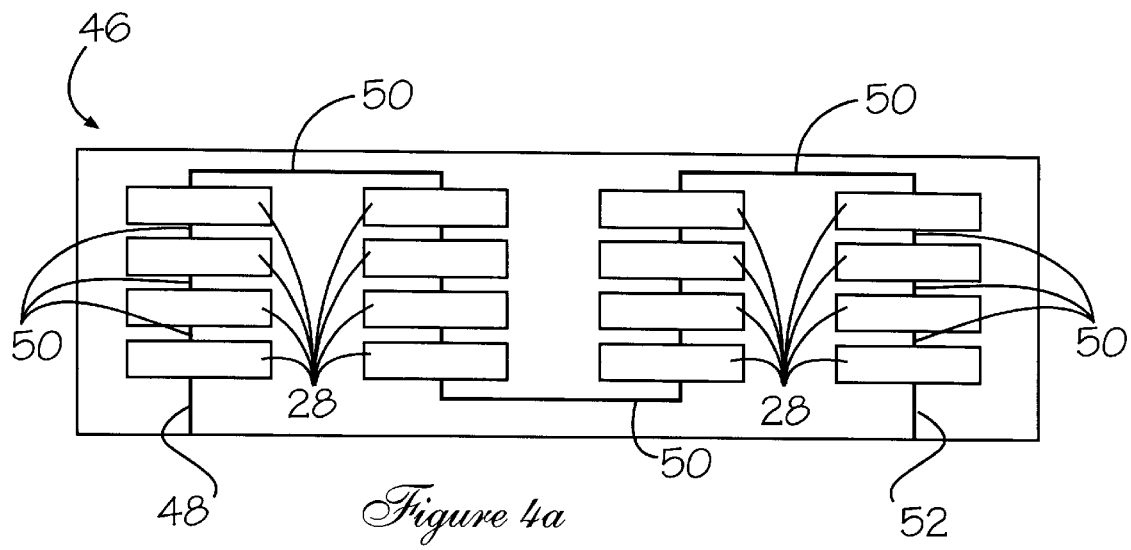
FIG. 4a is a front plan view of a memory card of the present invention shown in FIG. 3.
Figure 4B:
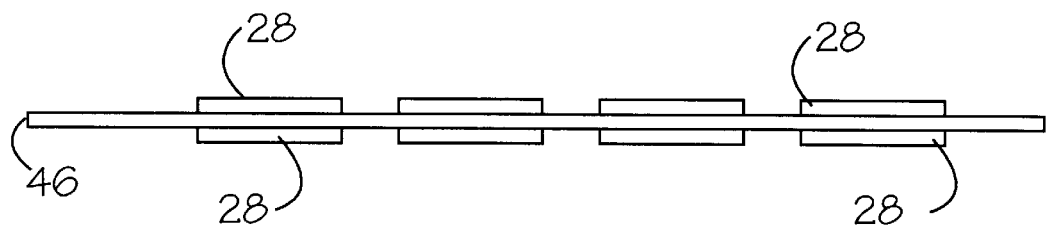
Figure 4C:
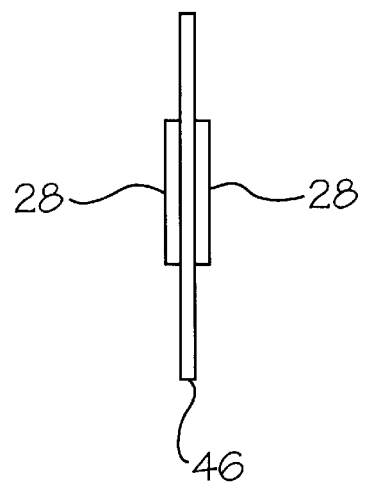

Referring now to FIGS. 4a, 4b, and 4c, there are shown front, top and side views, respectively, of the first inventive RIMM card 46 shown in FIG. 3. Since second RIMM card 54 (FIG. 3) is equivalent to first inventive RIMM card 46, the information presented in FIGS. 4a, 4b, and 4c applies to it as well. Memory devices 28 may be placed in any of a wide variety of physical arrangements on RIMM card 46. RAMBUS channel segment 20 (FIG. 3) enters RIMM card 46 at a bus entry region 48 and is then connected to memory devices 28 through device connection segments 50. The RAMBUS channel next exits second RIMM card 46, via a RAMBUS channel exit region 52, and passes from RIMM card 46 back to motherboard 12 (FIG. 3).

FIG. 4b is a top view of the inventive memory card 46 shown in FIG. 4a. As on RIMM card 24 (FIG. 2b), there are memory devices disposed on both sides of inventive RIMM card 46, but there are also several differences that are due primarily to the inventive wiring techniques discussed below. Firstly, there is only one memory device part number instead of two. The requirement for mirrored memory devices is eliminated, thereby requiring the manufacturer to carry and control only one memory device part number. It also minimizes the chances of placing a wrong component during assembly. Secondly, the memory devices are no longer required to be offset from one side to the other on RIMM card 46. This allows a significant improvement of the density of memory devices 28 on the RIMM card 46. This improvement may be used either to physically reduce the size of the card, to increase the number of memory devices on a given card, which may allow for reduction in the number of RIMM cards required, or a third option which is demonstrated in RIMM card 62 (FIG. 3), which is to incorporate terminations directly on the RIMM card.

FIG. 4c is a side view of the RIMM card of FIG. 4a, also showing memory devices 28 on both sides of RIMM card 46.

As stated hereinabove, two of the most important features of high speed, high capacity memory buses are that the effective impedance of the signal propagation paths is well controlled, and one end of the bus is terminated to the characteristic impedance of the bus in order to maintain signal fidelity and integrity.

Referring now to FIG. 5, a simple electrical model 70 of the signal path through an impedance-controlled memory card may be represented as a series of inductors, capacitors, and resistors. This type of electrical modeling is well known to those skilled in the art. The models may be as simple as that depicted in FIG. 5 to illustrate one aspect of the invention, or they may be significantly more complex models to accomplish the required goals or levels of detail. For example, although vias play an important role in allowing a multi-layer printed circuit board to interconnect all of the devices and I/O pads on a memory card, for simplicity they are not included in this model. For transmission line models, inductors are typically in series with the capacitors shunted to ground. The first inductor-capacitor pair may represent the impedance of a pad 72 on the memory card that attaches to a contact of the connector on the motherboard. The next pair may represent the impedance of a printed circuit trace 74 that connects the pad 72 to a memory device 76.

A simple model to represent a memory device 76 consists of three elements: two inductors 78 and 80 with a capacitor 82. This might typically be followed by a decoupling capacitor 84 as is commonly used with semiconductors being driven at high frequencies. An additional pair may represent the impedance of printed circuit trace 86 between memory devices 76, or between the end memory device and the termination 88. In a memory system in accordance with the invention, a typical system impedance is 28 ohms.

Now referring specifically to the electrical model for a memory device 76 (FIG. 5), the impedance and the intra-via lengths of the printed circuit traces are an integral part of the necessary matching system to compensate for the parasitic input capacitance 82 of the memory device 76. The model is actually a simple low-pass filter circuit where the series inductors 78 and 80 are transmission lines having a surge impedance greater than the effective through line impedance of 28 ohms. Raising the intra-via line impedance results in an excess inductance per unit length that approximates the required filter lumped inductance. The greater the line impedance, the greater the excess inductance per unit length.

It would be preferable to set the length of a printed circuit trace to the natural distance between the vias and to adjust the impedance of this trace to the value necessary to achieve the necessary excess inductance. In practice, single-sided memory card designs with long line requirements can tolerate this design approach, but it is not possible for double-sided memory cards.

The first limitation on line impedance is always the minimum allowable line width for a given set of printed circuit board design rules. Today this is typically 0.1 mm or about 0.004 inch. The combination of typical board cross-sections used today together with the dielectric constant of typical epoxy-glass-based materials used in printed circuit board fabrication (e.g., FR4), limits transmission line impedances to a maximum of about 53 ohms. Due to this limitation, the excess inductance requirement can be achieved only through a longer printed circuit line length.

As stated hereinabove, maintaining high electrical integrity (minimum crosstalk and impedance fluctuation) of the printed circuit line is a high priority. The usual approach is simply to meander the trace using large enough turn radii and to maintain a sufficient distance from adjacent printed circuit lines, also carrying high speed signals, to control the impedance and crosstalk. The layouts for double-sided memory cards, especially for those that are connecting very high density memory devices such as RAMBUS 256 MB or 288 MB RDRAM chips, do not have enough space for a simple meander. Compared to previous generations of RDRAM chips, the width of the 256 MB and 288 MB chips is narrower. This narrower pitch is very desirable since it clearly allows a much higher density of memory devices on a memory card compared to older-generation chips.

The solution to not having enough space to do a simple meander with adequate space surrounding the printed circuit trace is shown in FIG. 6. The circuitry in FIG. 6 is representative of a section 90 of a device connection segment 50, 58, or 66 (FIG. 3). Vias 92 connect the printed circuit trace 94 to the remainder of device connection segment 50, 58, or 66. The solution is to serpentine or foldback the traces 94 using the minimum conductor width and space allowed for a given set of printed circuit board design rules. This is typically 0.004 inch-wide conductors and either 0.004 or 0.005 inch-wide spaces.

This technique has not previously been performed since it affects the line impedance and induces phase dispersion. The impedance of the middle section 96 is lower than that of the outer two sections 98 due to electrical coupling. But these effects are well understood and can be accurately modeled and taken into account. This technique was previously used in microwave applications and was documented in "A New Class of Broad-Band Microwave 90-Degree Phase Shifters", by B. M. Schiffman, April 1958 in the IRE Transactions on Microwave Theory and Techniques. The design criteria for this section of printed circuit trace can be determined and the length of foldback necessary for the printed circuit trace to achieve the exact excess inductance required can be established.

It is now possible to use the same memory devices on both sides of the card, instead of using memory devices with mirrored I/O connections, as the prior art double-sided memory card required. This offers a significant advantage in managing chip supplies. The techniques just described can also be applied to a memory card that includes terminations directly on the card, as described below.

Figure 7A:
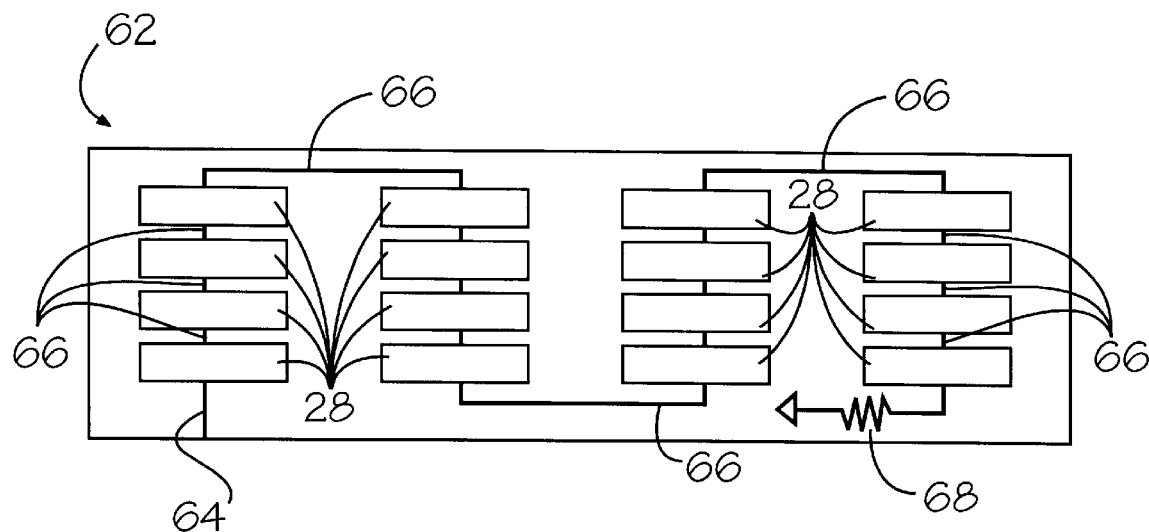
FIG. 7a is a front, plan view of the self-terminating memory card of the invention shown in FIG. 3.
Figure 7B:
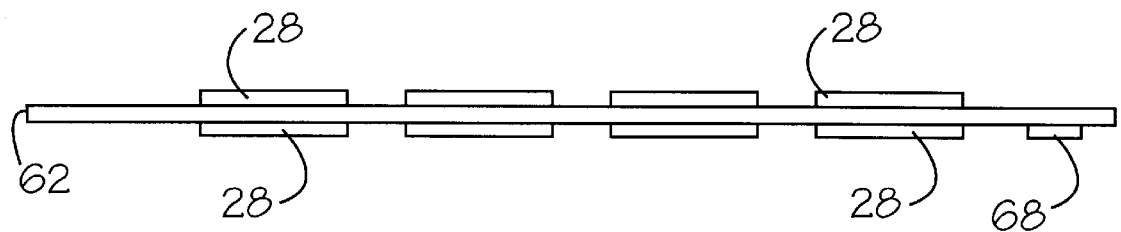
Figure 7C:
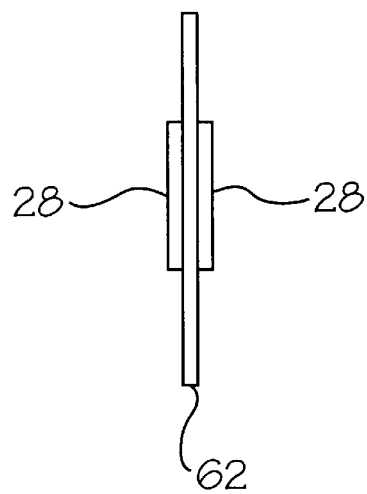

Referring now to FIGS. 7a, 7b and 7c, there are shown front, top, and side views, respectively, of a RIM card 62 having termination on the card as shown in FIG. 3. Memory devices 28 may be placed in any of a wide variety of physical arrangements on RIMM card 62. RAMBUS channel segment 37 (FIG. 3) enters RIMM card 62 at a bus entry region 64 and is then connected to memory devices 28 through device connection segments 66. Terminations 68 at the end of the RAMBUS channel are mounted directly on RIMM card 62, thereby eliminating the need for an exit portion of RAMBUS channel 30, 34, and 42 on prior art RIMM cards 24, 35, and 38 respectively (FIG. 1), and exit portion of RAMBUS channel 52 and 60 on inventive RIMM cards 46 and 54, respectively (FIG. 3). The complete, additional set of contacts is also eliminated.

FIG. 7b is a top view of the inventive memory card shown in FIG. 7a. As on inventive RIMM cards 46 and 54 (FIG. 3), memory devices 28 are disposed on both sides of RIMM card 62 using only one memory device part number Again, the memory devices need not be offset from one side of the card to the other. This significant improvement of the density of memory devices 28 on RIMM card 62 allows terminations 68 to reside on the card, and still allows for a reduction of the size of the card and/or an increase of the number of memory devices on a given card. The benefits of incorporating terminations directly on a memory card are described in more detail in copending U.S. patent applications, Ser. No. 09/645,859 and Ser. No. 09/461,069. It is also possible that with the use of such high capacity, high density memory devices as those described above, all of the memory necessary for a computer system may be contained on two, or even on one memory card, instead of the three memory card implementation described in FIG. 3. This too was described in more detail in copending U.S. patent applications, Ser. No. 09/645,859 and Ser. No. 09/461,069.

FIG. 7c is a side view of the RIMM card of FIG. 7a also showing memory devices 28 on both sides of RIMM card 62.

While a RAMBUS-based memory module has been chosen for purposes of disclosure, it should be obvious that the principles taught by the instant invention can be applied not only to other high speed memory modules, such as Double Data Rate (DDR) SDRAM from Micron Technology, but can also be readily applied to a wide variety of electronic packaging structures for many other applications requiring high speed and high performance including but not limited to microprocessor-, digital signal processor-, and telecommunications-based applications and subsystems.

Furthermore, while a module with devices on both the front and back sides has been chosen for purposes of disclosure, it should be obvious that the principles taught by the instant invention can also be applied to structures that have devices on only one side. This may become more beneficial as devices become larger and the density of interconnections increases.

Since other modifications and changes varied to fit particular operating requirements and environments will be apparent to those skilled in the art, this invention is not considered limited to the examples chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A high frequency memory module, comprising:
   a) a substrate having a front side, a back side, and at least one edge;
   b) a plurality of electrical contacts disposed along said at least one edge of said substrate adapted to connect to an external memory bus;
   c) electrical connection means operatively connected to said plurality of electrical contacts, forming an extension of said external memory bus; and
   d) a plurality of memory devices mounted on at least one of said front and said back sides of said substrate, said memory devices having high frequency electrical properties and being selectively connected to said extension of said external memory bus;
   e) bus termination means disposed on said substrate and operatively connected to said memory bus extension;
      whereby at least one of said electrical connection means compensates for said high frequency electrical properties of at least one of said memory devices.

2. The high-frequency memory module as recited in claim 1, wherein said external memory bus comprises a predetermined characteristic impedance.

3. The high frequency memory module as recited in claim 1, wherein said external memory bus comprises a socket adapted to receive said plurality of electrical contacts.

4. The high frequency memory module as recited in claim 3, wherein said socket comprises spring contacts adapted to grip said plurality of electrical contacts, thereby retaining said substrate in said socket and establishing an electrical connection between said external memory bus and said electrical contacts.

5. The high frequency memory module as recited in claim 1, wherein said at least one of said electrical connection means for compensating for said high frequency electrical properties of said at least one of said memory devices is a meander.

6. The high frequency memory module as recited in claim 5, wherein said meander comprises at least one from the group: serpentine, folded-back group of patterns.

7. The high frequency memory module as recited in claim 1, wherein said plurality of memory devices has an identical pattern of electrical contacts for connection to said front and said back side of said substrate.

8. The high frequency memory module as recited in claim 1, wherein said bus termination means exhibits an impedance substantially matching said characteristic impedance of said external memory bus.

9. The high frequency memory module as recited in claim 1, wherein said bus termination means comprises electrical components from the group: resistors, capacitors and inductors disposed on said substrate and electrically connected to respective lines comprising said memory bus extension.

10. The high-frequency memory module as recited in claim 9, wherein said resistors comprise discrete resistors.

11. The high-frequency memory module as recited in claim 9, wherein said resistors comprise a resistor pack.

12. The high-frequency memory module as recited in claim 9, wherein said resistors comprise a solid-state resistive device.

13. A high frequency module, comprising:
   a) a substrate having a front side, a back side, and at least one edge;
   b) a plurality of electrical contacts disposed along said at least one edge of said substrate adapted to connect to an external data bus;
   c) electrical connection means operatively connected to said plurality of electrical contacts, forming an extension of said external data bus; and
   d) a plurality of devices mounted on at least one of said front and said back sides of said substrate, said devices having high frequency electrical properties and being selectively connected to said extension of said external data bus;
   e) bus termination means disposed on said substrate and operatively connected to said data bus extension;
      whereby at least one of said electrical connection means compensates for said high frequency electrical properties of at least one of said devices.

14. The high-frequency module as recited in claim 13, wherein said external data bus comprises a predetermined characteristic impedance.

15. The high frequency module as recited in claim 13, wherein said external data bus comprises a socket adapted to receive said plurality of electrical contacts.

16. The high frequency module as recited in claim 15, wherein said socket comprises spring contacts adapted to grip said plurality of electrical contacts, thereby retaining said substrate in said socket and establishing an electrical connection between said external data bus and said electrical contacts.

17. The high frequency module as recited in claim 13, wherein said at least one of said electrical connection means for compensating for said high frequency electrical properties of said at least one of said devices is a meander.

18. The high frequency module as recited in claim 17, wherein said meander comprises at least one from the group: serpentine, folded-back group of patterns.

19. The high frequency module as recited in claim 13, wherein said plurality of devices has an identical pattern of electrical contacts for connection to said front and said back side of said substrate.

20. The high frequency module as recited in claim 14, wherein said bus termination means exhibits an impedance substantially matching said characteristic impedance of said external data bus.

21. The high frequency module as recited in claim 18, wherein said bus termination means comprises electrical components from the group: resistors, capacitors and inductors disposed on said substrate and electrically connected to respective lines comprising said data bus extension.

22. The high-frequency module as recited in claim 21, wherein said resistors comprise discrete resistors.

23. The high-frequency module as recited in claim 21, wherein said resistors comprise a resistor pack.

24. The high-frequency module as recited in claim 21, wherein said resistors comprise a solid-state resistive device.

\* \* \* \* \*